United States Patent [19]

Koenig

[11] 4,298,904
[45] Nov. 3, 1981

[54] ELECTRONIC CONDUCTION COOLING CLAMP

[75] Inventor: Philip C. Koenig, Bainbridge Island, Wash.

[73] Assignee: The Boeing Company, Seattle, Wash.

[21] Appl. No.: 104,643

[22] Filed: Dec. 17, 1979

[51] Int. Cl.³ ............................................. H05K 7/20
[52] U.S. Cl. ............................. 361/386; 174/16 HS; 165/80 B
[58] Field of Search ................ 361/381, 382, 385–389, 361/399, 415; 174/16 HS; 211/41; 357/82; 165/80 R, 80 A, 80 B, 80 D

[56] References Cited

U.S. PATENT DOCUMENTS

| | | | |
|---|---|---|---|
| 3,678,342 | 7/1972 | Shaw | 361/386 |
| 3,865,183 | 2/1975 | Roush | 361/385 |
| 3,970,198 | 7/1976 | Prater | 339/75 MP |
| 4,120,021 | 10/1978 | Roush | 361/386 |
| 4,157,583 | 6/1979 | Basmajian | 361/388 |
| 4,214,292 | 7/1980 | Johnson | 361/386 |

*Primary Examiner*—Gerald P. Tolin
*Attorney, Agent, or Firm*—Thomas H. Murray; H. Gus Hartmann; Bernard A. Donahue

[57] ABSTRACT

Clamp means for securing a printed circuit board to a chassis or "cold wall" with improved heat transfer characteristics. The chassis, which acts as a heat sink, is provided with elongated slots which receive the opposite edges of a heat conductive metallic plate sandwiched between insulating printed circuit layers of the printed circuit card. Disposed within each slot is an elongated clamp which, when set, not only forces the heat conductive plate into contact with a first wall of the elongated slot but also exerts a force against, and is in abutting relationship with, a wall normal to the first wall. This maximizes the cross-sectional area of the path through which heat can flow from the heat conductive metallic plate to the chassis, thus improving the heat transfer characteristics.

3 Claims, 9 Drawing Figures

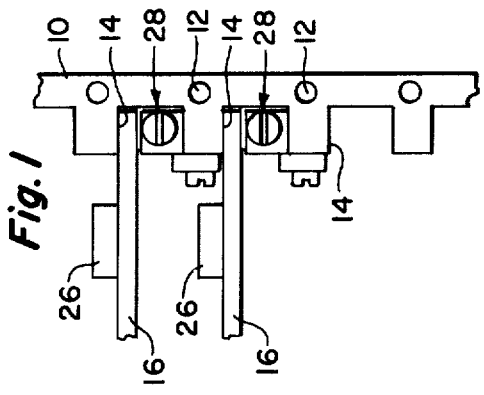
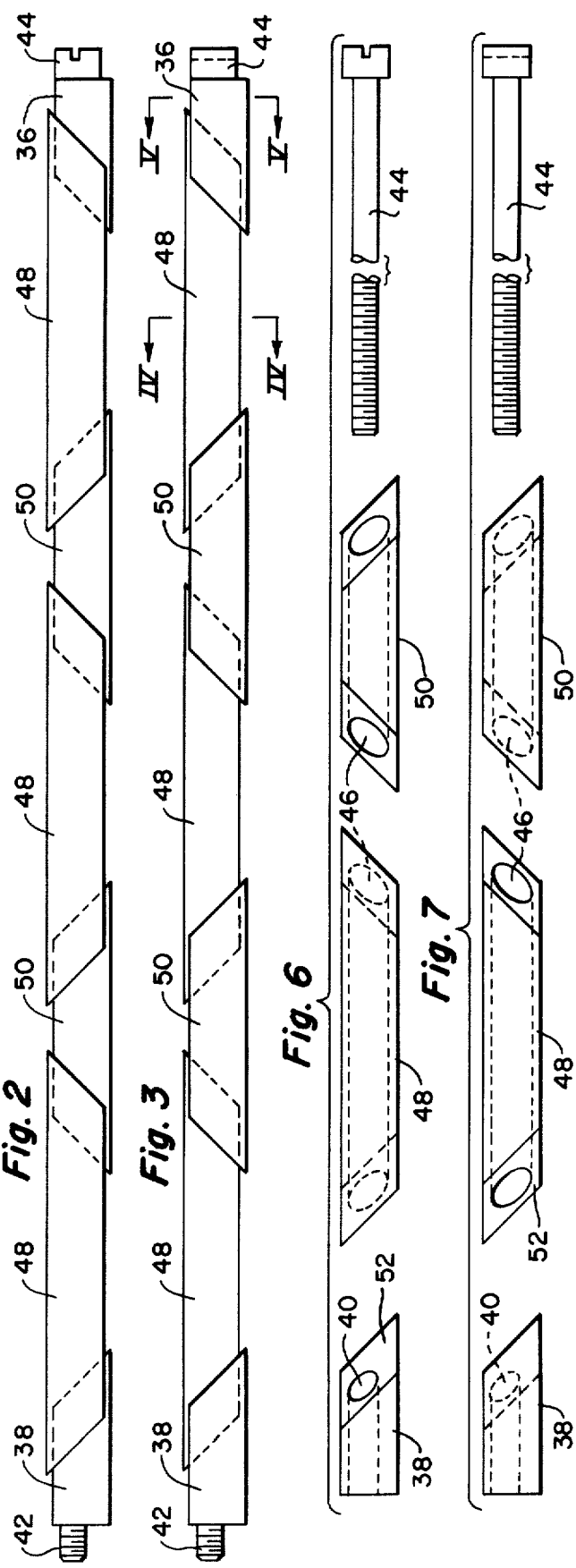

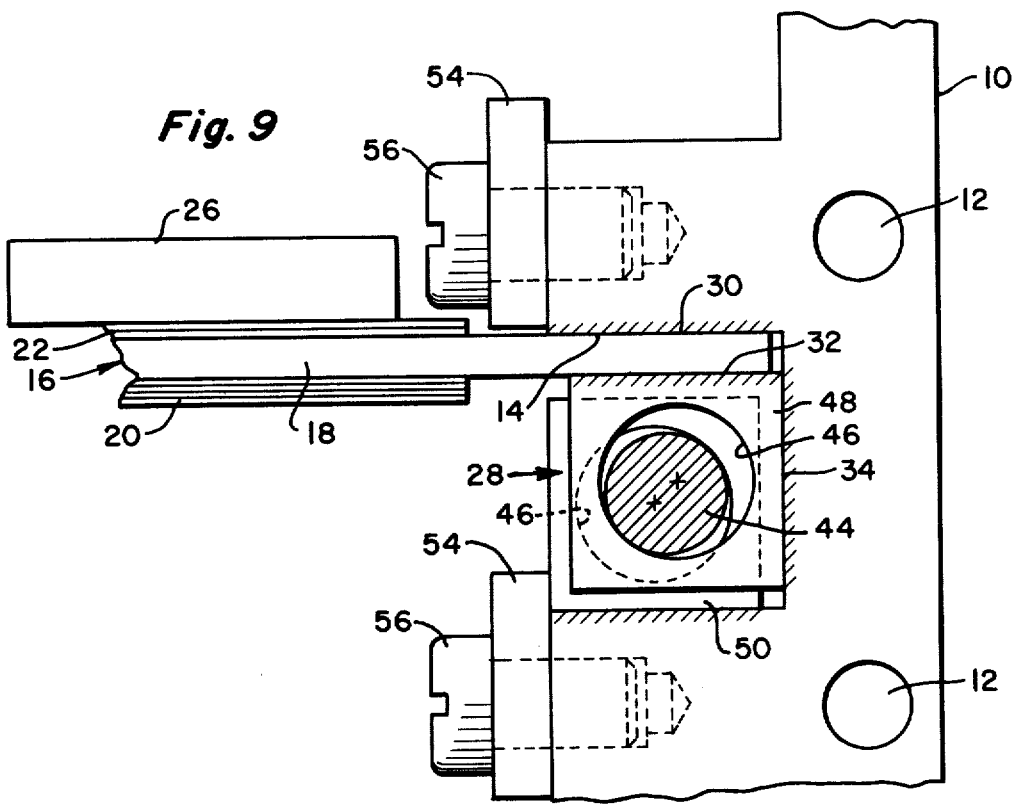
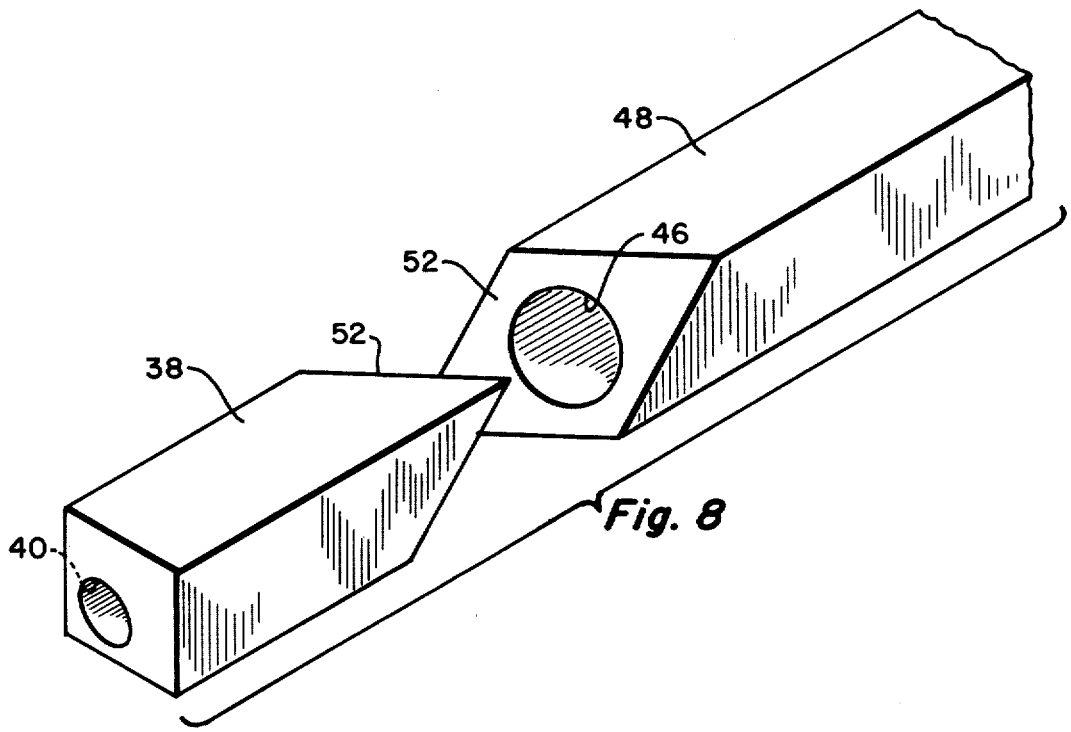

ial of high heat conductivity, such as copper. On opposite sides of the plate 18 are insulating layers 20 and 22 on which a printed

ELECTRONIC CONDUCTION COOLING CLAMP

BACKGROUND OF THE INVENTION

In the past, various systems have been devised for clamping the opposite edges of a printed circuit board heat conductive plate to a chassis which acts as a heat sink to carrry away heat generated by printed circuit components on opposite sides of the conductive plate. In many cases, the edges of the heat conductive plate are held within slots in the chassis by camming arrangements, typical camming arrangements being shown, for example, in U.S. Pat. Nos. 3,865,183; 3,970,198; 4,120,021, and 4,157,583.

Methods for increasing the heat transfer efficiency in printed circuit boards are receiving greater consideration in the overall packaging design of electronic systems. One reason for this is that maximum levels of device integration are being reached. In this respect, further component density cannot be efficiently compensated for by an associated increase in power dissipation.

One method of compensating for the increased power consumption is to reduce the resistance to heat flow occurring at the contact interface between the printed circuit board and the chassis or cold walls which support the board. Solid conduction through the actual contact area consists of many small points of contact. These are generally just a small fraction of the total contact area. The area depends upon the surface roughness, material malleability, flatness of the surfaces in contact and the contact pressure. Generally, the smoother the surface, the greater the number of points of actual contact. Also, the number of contact points and the area of contact at each point is related to pressure. As the Meyer hardness (i.e., resistance to indentation) is reached, the material at the points of contact will flow plastically until the Meyer hardness equals the contact pressure. This mechanism causes an increase in the true contact area to occur. In addition to solid conduction through the actual contact area, there is also conduction through an interstitial fluid or filler present in the void spaces between the points of actual contact. At low contact pressures, the major mode of heat transfer is through the void spaces.

Needless to say, it is highly desirable to maximize the cross-sectional contact area between the printed circuit board and the chassis in order to create the least possible resistance to heat flow. One difficulty with prior art camming arrangements is that the cam exerts a force on the conductive plate of the printed circuit board in one direction only. That is, the efficiency of the clamp is dependent on forcing a surface of the conductive plate against a single surface of the chassis. Conduction through the other side of the conductive plate is greatly limited since the surfaces of the cams which engage the side of the plate are usually very small in conducting area.

SUMMARY OF THE INVENTION

In accordance with the present invention, the heat transfer characteristics of a clamping device for printed circuit boards and the like is provided wherein compound angles on wedges translate an axial force into two forces at right angles thereto and result in the wedges contacting three heat transferring surfaces. Thus, in contrast to conventional conduction cooling wedges wherein contact in made only with two surfaces, the present invention provides a means for contacting an additional surface which aids in the reduction of the temperature of components on the printed circuit board.

Specifically, there is provided a mounting device for electrical circuit boards comprising a chassis of high heat conductivity material having at least one slot therein for receiving the end of a high heat conductivity plate extending from the edge of an insulating printed circuit board or the like. Means are provided for clamping the end of the plate to a wall of the slot, the clamping means comprising wedge-shaped elements movable on other wedge-shaped elements into a position where they engage a surface of the plate to press it against a wall of the slot while themselves engaging a second wall of the slot at right angles to the first-mentioned wall.

In the preferred embodiment of the invention, the wedge-shaped elements are spaced along the shank of a screw which threads into a threaded hole extending through the last of the wedge-shaped elements such that when the screw is turned, the elements are drawn together or separated, depending upon the direction of rotation of the screw. The facing end surfaces of the wedge-shaped elements are beveled in two directions, preferably along 45° angles. In this manner, as the wedge-shaped elements are drawn together, they tend to spread apart along a 45° angle whereby contact is made with two surfaces at right angles to each other.

The above and other objects and features of the invention will become apparent from the following detailed description taken in connection with the accompanying drawings which form a part of this specification, and in which:

FIG. 1 is an end view of a cold plate or chassis for printed circuit cards employing the clamp of the invention;

FIG. 2 is a top view of the clamp of the invention;

FIG. 3 is a side view of the clamp shown in FIG. 2;

FIG. 4 is a cross-sectional view taken along line IV—IV of FIG. 3;

FIG. 5 is a cross-sectional view taken along line V—V of FIG. 3;

FIG. 6 is an exploded top view of certain of the wedge-shaped elements employed in the clamp of FIGS. 2 and 3;

FIG. 7 is an exploded side view of the elements shown in FIG. 6;

FIG. 8 is a perspective view of two of the wedge-shaped elements employed in the clamp of the invention; and FIG. 9 is a view, similar to FIG. 1, showing the manner in which the wedge-shaped elements spread apart to abut two surfaces of a slot formed in a cold wall.

With reference now to the drawings, and particularly to FIG. 1, there is shown one of two cold walls 10 of a chassis for printed circuit boards. The cold wall has cooling passageways 12 formed therein through which a cooling fluid passes. The cold wall 10 is formed on its inner face with slots 14 extending along its length. These receive the ends of printed circuit boards, generally indicated by the reference numeral 16. The details of the printed circuit boards are shown in FIG. 9. Each comprises a central metallic plate 18, preferably formed from aluminum or some other mateial of high heat conductivity, such as copper. On opposite sides of the plate 18 are insulating layers 20 and 22 on which a printed circuit is formed. Also carried on the insulating layers are electronic components, one of which is indicated in FIGS. 1 and 9 by the reference numeral 26.

The insulating layers 20 and 22 do not extend to the opposite ends of the plate 18. Rather, the opposite edges of the plate 18 are exposed such that when they are clamped within the slots 14, good thermal contact is established between the surfaces of the plate 18 and at least one surface of the slot 14. The ends of the plates 18 are held within the slots 14 by means of elongated clamps 28 about to be described.

As was explained above, it has been common in the prior art to clamp the ends of the plates 18 within the slots 14 with cam-type clamping devices which simply push the upper surface of the plate 18 against the upper surface of the slot 14, this upper surface being indicated by the reference numeral 30 in FIG. 9. With this type of clamp, very little heat conduction is achieved from the bottom surface of the plate 18 through the clamping device and into the bottom or side wall of the slot 14. In accordance with the present invention, however, a clamp is provided which makes contact with not only the lower surface 32 of the plate 18 but also the side wall 34 of the slot 14. Thus, there are effectively two heat flow paths, one of which is through the wall 30 and the other of which is through the lower wall or surface 32 and the wall 34 of the slot 14. A third path, although much less effective, is from surface 32, through elements 48, to elements 36, 38 and 50 to the lower surface of slot 14.

The details of the clamps 28 are shown in FIG. 2-8. Each clamp comprises end pieces 36 and 38 which, as shown in FIG. 5, have holes 40 extending therethrough which are offset or eccentric with respect to the center of the piece. The hole 40 in piece 38 at the end of the clamp is threaded to receive threads 42 on the end of an elongated screw 44. The shank of the screw 44 extends through openings 46 (FIG. 4) extending through five wedge-shaped elements. Three of the five wedge-shaped elements are identical and are identified by the reference numeral 48 while the remaining elements which are between the elements 48 are also identical and identified by the reference numeral 50.

As is best shown in FIGS. 6-8, the facing ends of the wedge-shaped elements 48 and 50 are beveled in two directions at 45°, thereby forming mating end surfaces 52 which can slide on each other to cause the elements 48, for example, to move at an angle of 45° with respect to the top and side surfaces of the respective elements. The openings 46 extending through the elements 48 and 50 are of much larger diameter than the openings 40 as shown in FIGS. 4, 5 and 8 and are coaxial with the axes of the elements 48 and 50. Consequently, it will be appreciated that the elements 48 can move upwardly and to the right, for example, with respect to the elements 36, 38 and 50. This is perhaps best shown in FIG. 9. Provided on the forward edge of each of the slots 14 is a butt plate 54 held in place against the cold wall 10 by means of screws 56. The clamps 28 are placed within the slots 14 and the screw 44 rotated to draw element 38 toward element 36. In this process, the elements 48, as shown in FIG. 9, will slide upwardly and backwardly at an angle of 45° with respect to the top and bottom of the slot 14 as the screw 44 is tightened. In this process, elements 36, 38 and 50 are forced to abut the butt plates 54; while elements 48 are forced upwardly at an angle of 45° until one of their surfaces engages the lower side 32 of the conductive plate 18 and forces it upwardly against wall 30. At this point, another wall of each element 48 abuts the back wall 34 of an associated slot 14. This effects the thermal contact described above wherein heat can now be conducted from the plate 18 to either wall 30 or to wall 34 through surface 32. The result is a much better and larger path for thermal conduction which enables more heat to be generated by the components on the printed circuit board 16.

Although the invention has been shown in connection with a certain specific embodiment, it will be readily apparent to those skilled in the art that various changes in form and arrangement of parts may be made to suit requirements without departing from the spirit and scope of the invention.

I claim as my invention:

1. A device comprising a clamp mounting an edge portion of a printed circuit board into a channel guide having interior opposing wall surfaces and an interconnecting wall surface, said device comprising: an elongated bar assembly of rectangular cross-section and having lengthwise a series of end-to-end bar segments with a hole extending longitudinally therethrough; a bolt having a head, a shank threaded at its end portion and being inserted through said hole in the elongated bar assembly; said elongated bar assembly having end bar segments at each end thereof wherein said hole is parallel offset from the longitudinal centerline of each of said end bar segments; one of said end bar segments being located at the head end of said bolt and having a hole diameter approximately equal to that of the bolt shank diameter for a close sliding fit; the other of said end bar segments being located at the shank end of said bolt and having a threaded hole for screwing onto the threaded shank end portion of said bolt; intermediate bar segments, between said head end bar segment and said shank end bar segment, wherein said hole is coaxial with the longitudinal centerline of said intermediate bar segments and of a substantially larger diameter than the shank diameter of said bolt extending therethrough; said intermediate bar segments, comprising in alternate series, a first set and a second set of intermediate bar segments having end facing surfaces abutting along an inclined plane such that said first and second set of intermediate bar segments spread divergently apart with their longitudinal centerlines remaining parallel to the bolt axis upon screwing the bolt into said threaded shank end bar segment and drawing the end bar segments tightly together; said first set of intermediate bar segments applying a force against said printed circuit board edge portion pressing it firmly against a first interior opposing wall surface of said channel guide and simultaneously bearing against the interconnecting wall surface of said channel guide; said second set of intermediate bar segments bearing against a second interior opposing wall surface of said channel guide; whereby said first set and said second set of intermediate bar segments provide a contact area with each of the interior wall surfaces of said channel guide thereby producing three thermal conductive paths between said printed circuit board edge portion and said channel guide.

2. A device comprising a clamp mounting an edge portion of a printed circuit board into a channel guide having interior opposing wall surfaces and an interconnecting wall surface, said device comprising: a bolt; an elongated bar assembly comprising a lengthwise series of bar segments, of rectangular cross-section, having a hole extending longitudinally therethrough of substantially larger diameter than the shank diameter of said bolt and being loosely supported on said bolt in an end-to-end relationship; said bar segments comprising in alternate series, a first set and a second set of bar segments, and each set of bar segments having end facing surfaces contacting along planes inclined to the longitudinal axis of the shank of said bolt; means for tightening said bolt to apply an end force to said first and second set of bar segments, to draw them together, producing a sliding motion between the end facing surfaces of the bar segments along said inclined planes, to spread said first and second sets of bar segments apart parallel and divergently from the longitudinal axis of said bolt shank; said first set of bar segments pressing the edge portion of the printed circuit board against one of the interior opposing wall surfaces of the channel guide and simultaneously bearing against the interconnecting wall surface of said channel guide; said second set of bar segments bearing against the other of the interior opposing wall surfaces of said channel guide; and thereby, providing thermal conduction paths from the edge portion of the printed circuit board to the three interior wall surfaces of said channel guide.

3. A device comprising a clamp mounting an edge portion of a printed circuit board into a channel guide having interior opposing wall surfaces and an interconnecting wall surface, said device comprising: a bolt; an elongated bar assembly comprising a lengthwise series of bar segments, of rectangular cross-section, having a hole extending longitudinally therethrough of substantially larger diameter than the shank diameter of said bolt and being loosely supported on said bolt shank in an end-to-end relationship; each of said bar segments having an end surface formed by a transverse plane oriented along a line bisecting opposite corner angles of the rectangular cross-section and inclined at an angle of approximately forty-five degrees to the longitudinal centerline of each of said bar segments; the end surfaces of each of said bar segments being oppositely inclined to said angle of approximately forty-five degrees to the longitudinal centerline of each of said bar segments, forming a truncated equilateral triangle type of bar segment; said elongated bar assembly comprising in alternate series, a first set and a second set of bar segments; means for tightening said bolt to apply an end force to said first and second set of bar segments, to draw them together, producing a sliding motion between the end facing surfaces of the bar segments along said inclined planes to spread said first and second sets of bar segments apart divergently parallel from the longitudinal axis of said bolt shank; said first set of bar segments pressing the edge portion of the printed circuit board against one of the interior opposing wall surfaces of the channel guide and simultaneously bearing against the interconnecting wall surface of said channel guide; said second set of bar segments bearing against the other of the interior opposing wall surfaces of said channel guide; thereby providing thermal conduction paths from the edge portion of the printed circuit board to the three interior wall surfaces of said channel guide.

* * * * *